(12) United States Patent
O'Sullivan et al.

(10) Patent No.: US 11,315,015 B2
(45) Date of Patent: Apr. 26, 2022

(54) CONTINUOUS LEARNING OF SIMULATION TRAINED DEEP NEURAL NETWORK MODEL

(71) Applicant: TECHNIP FRANCE, Courbevoie (FR)

(72) Inventors: James Francis O'Sullivan, Houston, TX (US); Djoni Eka Sidarta, Houston, TX (US); Ho Joon Lim, Katy, TX (US)

(73) Assignee: TECHNIP FRANCE, Courbevoie (FR)

( * ) Notice: Subject to any disclaimer, the term of this patent is extended or adjusted under 35 U.S.C. 154(b) by 970 days.

(21) Appl. No.: 16/003,443

(22) Filed: Jun. 8, 2018

(65) Prior Publication Data

US 2019/0378005 A1    Dec. 12, 2019

(51) Int. Cl.
| | |
|---|---|
| *G06N 3/08* | (2006.01) |
| *G06N 3/04* | (2006.01) |
| *G06N 20/00* | (2019.01) |
| *B63B 21/50* | (2006.01) |

(Continued)

(52) U.S. Cl.
CPC .............. *G06N 3/08* (2013.01); *B63B 21/50* (2013.01); *B63B 71/10* (2020.01); *G06N 3/04* (2013.01);

(Continued)

(58) Field of Classification Search
CPC .. G06N 3/02; G06N 3/04; G06N 3/08; G06N 20/00; G06N 20/10; G06N 20/20;

(Continued)

(56) References Cited

U.S. PATENT DOCUMENTS

| | | | |
|---|---|---|---|
| 5,920,852 A | 7/1999 | Graupe | |
| 10,800,040 B1 * | 10/2020 | Beckman | ............... B25J 9/1605 |

(Continued)

FOREIGN PATENT DOCUMENTS

| | | |
|---|---|---|
| CN | 107545250 A | 1/2018 |
| JP | 2003-22134 A | 1/2003 |

OTHER PUBLICATIONS

Mauries, L., International Search Report for International Patent Application No. PCT/IB2019/000748, dated Oct. 25, 2019, European Patent Office.

(Continued)

*Primary Examiner* — Shane D Woolwine
(74) *Attorney, Agent, or Firm* — Jackson Walker, LLP

(57) ABSTRACT

The present invention provides a system and method of side-stepping the need to retrain neural network model after initially trained using a simulator by comparing real-world data to data predicted by the simulator for the same inputs, and developing a mapping correlation that adjusts real world data toward the simulation data. Thus, the decision logic developed in the simulation-trained model is preserved and continues to operate in an altered reality. A threshold metric of similarity can be initially provided into the mapping algorithm, which automatically adjusts real world data to adjusted data corresponding to the simulation data for operating the neural network model when the metric of similarity between the real world data and the simulation data exceeds the threshold metric. Updated learning can continue as desired, working in the background as conditions are monitored.

7 Claims, 3 Drawing Sheets

(51) Int. Cl.
  *B63B 71/10* (2020.01)
  *G06F 30/20* (2020.01)
  *G06N 3/02* (2006.01)
(52) U.S. Cl.
  CPC ............. *G06N 20/00* (2019.01); *G06F 30/20* (2020.01); *G06N 3/02* (2013.01)
(58) Field of Classification Search
  CPC ......... G06F 30/20; B63B 21/00; B63B 21/50; B63B 21/505; B63B 71/00; B63B 71/10
  See application file for complete search history.

(56) References Cited

U.S. PATENT DOCUMENTS

2012/0078436 A1   3/2012   Patel
2014/0063061 A1*  3/2014   Reitan .................... G09G 3/003
                                                                345/633

OTHER PUBLICATIONS

Mauries, L., Written Opinion for International Patent Application No. PCT/IB2019/000748, dated Oct. 25, 2019, European Patent Office.

Hornik, K, Stinchcombe, M., White, H., "Multilayer feedforward networks are universal approximators", Deep Learning, 1989, 13 pages.

Funahashi, K., "On the Approximate Realization of Continuous Mappings", Neural Networks, Dec. 1989, pp. 183-192, vol. 2.

Cybenko, G., "Approximation by Superpositions of a Sigmoidal Function", Mathematics of Control, Signals, and Systems, 1989, pp. 303-314.

Haykin, Simon, Neural Networks: A Comprehensive Foundation, Prentice Hall, pp. 176-177.

* cited by examiner

CONTINUOUS LEARNING OF SIMULATION TRAINED DEEP NEURAL NETWORK MODEL

CROSS REFERENCE TO RELATED APPLICATIONS

Not applicable.

STATEMENT REGARDING FEDERALLY SPONSORED RESEARCH OR DEVELOPMENT

Not applicable.

REFERENCE TO APPENDIX

Not applicable.

BACKGROUND OF THE INVENTION

Field of the Invention

The disclosure generally relates to the neural network model training and operation using a simulator and adjustment factors for the simulator. More particularly, the disclosure relates to neural network model training and operation for floating production platforms, vessels, and other floating systems.

Description of the Related Art

In producing hydrocarbons from subsea formations, floating production platforms, vessels, and other floating production systems are typically moored or otherwise maintained in position during operations. The mooring lines periodically need repair or replacement. Because many mooring lines are typically used, a deteriorated condition or even a failure of a mooring line may not be immediately noticeable to operators under normal conditions. However, extreme conditions may test the integrity of the mooring line system. If the remaining mooring lines are overstressed under the extreme conditions, then the entire floating production system may be compromised or fail.

It is desirable for predictive modelling to predict the condition of the mooring line system based on real world movement of the floating production systems compared to expected movement. A neural network model can provide a robust system that can learn in time and adjust for conditions for more accurate responses. Neural network models (NN model) are systems of interconnected neurons that correlate known inputs to known outputs in order to generate a complex weighted high order, non-linear polynomial to predict outputs with inputs. Typically, the inputs and outputs are derived from a functioning system, thus requiring considerable time before a sufficient set of data is accumulated for training the system, and also not be available during that real time functioning period.

An alternative is to train the NN model with a simulation of the system operation. The simulated input/output greatly speeds up the learning process and makes a neural network model available from the beginning of operations. However, the initial simulation training necessitates verifying the simulation accuracy in parallel to the NN model operating under real world conditions. The verification typically means generating a new set of inputs and outputs regarding the simulation accuracy followed by retraining the NN model, and then uploading the new NN model, adding costs and time to the NN model functioning as intended.

While the NN model provides opportunities of operating improvements of floating production systems, a better system and method is needed to train the NN model to operate in the given environment and in other applications.

SUMMARY OF THE INVENTION

The present invention provides a system and method of side-stepping the need to retrain neural network model after initially trained using a simulator by comparing real-world data to data predicted by the simulator for the same inputs, and developing a mapping correlation that adjusts real world data toward the simulation data. Thus, the decision logic developed in the simulation trained NN model is preserved and continues to operate in what can be described as an altered reality. A threshold metric of similarity, such as a percentage of correlation, can be initially provided into the mapping algorithm, which automatically adjusts real world data to adjusted data corresponding to the simulation data for operating the neural network model when the metric of similarity between the real world data and the simulation data exceeds the threshold metric. Updated learning can continue as desired, working in the background as system conditions are monitored, such as for a floating production system. When the real data is within the threshold metric, the real data can be provided to the NN model as operational data. When the real world data exceeds the threshold metric from the simulation data, the system can begin to adjust inputs to the NN model by adjusting the real world data to adjusted data corresponding to the simulation data. The adjusted data can be provided to the NN model as operational data. Updated learning can continue as desired, working in the background as conditions are monitored.

The disclosure provides a method of operating a neural network model, comprising: providing simulation data to the neural network model, the simulation data including at least one simulated value of a variable and at least one simulation result corresponding to the at least one simulated value of the variable; providing decision logic to the neural network model to process the simulation data for a neural network model output; obtaining real world data including at least one real world value of the variable and at least one real world result corresponding to the at least one real world value of the variable; comparing the real world data with the simulation data to determine a metric of similarity between the real world data and the simulation data; providing the real world data as operational data for the neural network model if the metric of similarity is simulation data greater than a threshold metric to produce an output corresponding to an output with the simulation data from the neural network model; adjusting the real world data to correspond with the simulation data and providing the adjusted data as the operational data for the neural network model if the metric is not greater than the threshold metric; and operating the neural network model with the adjusted data that corresponds at least within the range of the simulation data to produce an output with the adjusted data corresponding to an output with the simulation data from the neural network model.

The disclosure also provides a system comprising: a central processing unit; a non-transitory computer readable memory including processor executable program instructions that, when executed cause the central processing unit to perform operations comprising: storing simulation data in memory for a neural network model, the simulation data including at least one simulated value of a variable and at least one simulation result corresponding to the at least one simulated value of the variable; storing decision logic simulation data in the memory for the neural network model to process the simulation data; storing real world data in the memory including at least one real world value of the variable and at least one real world result corresponding to the at least one real world value of the variable; comparing the real world data with the simulation data to determine a metric of similarity between the real world data and the simulation data; providing the real world data as operational data for the neural network model if the metric of similarity is greater than a threshold metric simulation data to produce an output corresponding to an output with the simulation data from the neural network model; adjusting the real world data to correspond with the simulation data and providing the adjusted data as the operational data for the neural network model if the metric is not greater than the threshold metric; and operating the neural network model with the adjusted data that corresponds at least within the range of the simulation data to produce an output with the adjusted data corresponding to an output with the simulation data from the neural network model.

DETAILED DESCRIPTION

Figure 1:
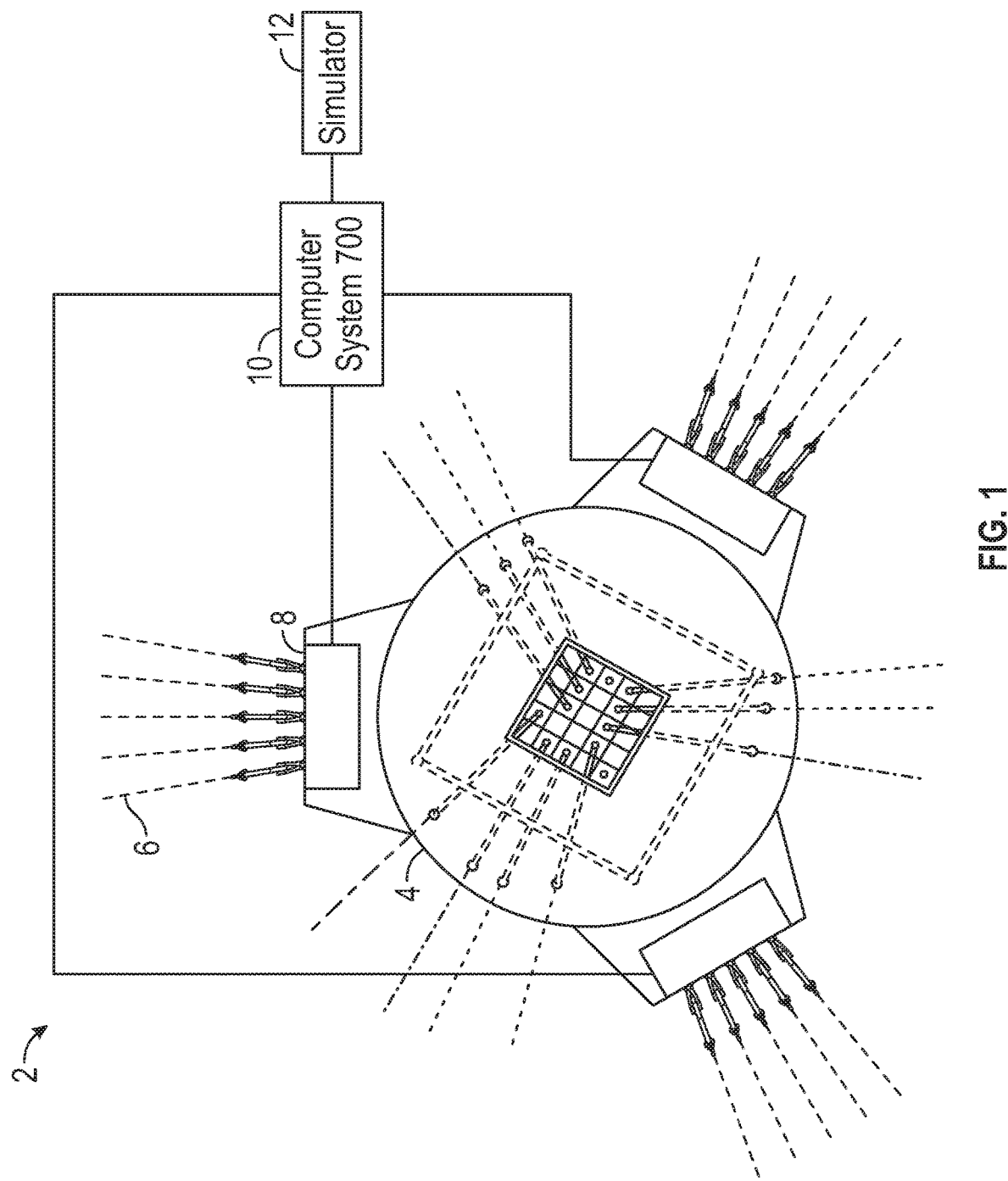
FIG. 1 is a schematic top view of an example of a floating system with mooring lines and a monitoring system.

The Figures described above and the written description of specific structures and functions below are not presented to limit the scope of what Applicant has invented or the scope of the appended claims. Rather, the Figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present disclosure will require numerous implementation-specific decisions to achieve the developer's ultimate goal for the commercial embodiment. Such implementation-specific decisions may include, and likely are not limited to, compliance with system-related, business-related, government-related, and other constraints, which may vary by specific implementation or location, or with time. While a developer's efforts might be complex and time-consuming in an absolute sense, such efforts would be, nevertheless, a routine undertaking for those of ordinary skill in this art having benefit of this disclosure. It must be understood that the inventions disclosed and taught herein are susceptible to numerous and various modifications and alternative forms. The use of a singular term, such as, but not limited to, "a," is not intended as limiting of the number of items. Further, the various methods and embodiments of the system can be included in combination with each other to produce variations of the disclosed methods and embodiments. Discussion of singular elements can include plural elements and vice-versa. References to at least one item may include one or more items. Also, various aspects of the embodiments could be used in conjunction with each other to accomplish the understood goals of the disclosure. Unless the context requires otherwise, the term "comprise" or variations such as "comprises" or "comprising," should be understood to imply the inclusion of at least the stated element or step or group of elements or steps or equivalents thereof, and not the exclusion of a greater numerical quantity or any other element or step or group of elements or steps or equivalents thereof. The device or system may be used in a number of directions and orientations. The terms "top", "up", "upward", "bottom", "down", "downwardly", and like directional terms are used to indicate the direction relative to the figures and their illustrated orientation and are not absolute in commercial use but can vary as the assembly varies its orientation. The order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions. Some elements are nominated by a device name for simplicity and would be understood to include a system of related components that are known to those with ordinary skill in the art and may not be specifically described. Various examples are provided in the description and figures that perform various functions and are non-limiting in shape, size, description, but serve as illustrative structures that can be varied as would be known to one with ordinary skill in the art given the teachings contained herein. As such, the use of the term "exemplary" is the adjective form of the noun "example" and likewise refers to an illustrative structure, and not necessarily a preferred embodiment.

The present invention provides a system and method of side-stepping the need to retrain neural network model after initially trained using a simulator by comparing real-world data to data predicted by the simulator for the same inputs, and developing a mapping correlation that adjusts real world data toward the simulation data. Thus, the decision logic developed in the simulation-trained model is preserved and continues to operate in an altered reality. A threshold metric of similarity can be initially provided into the mapping algorithm, which automatically adjusts real world data to adjusted data corresponding to the simulation data for operating the neural network model when the metric of similarity between the real world data and the simulation data exceeds the threshold metric. Updated learning can continue as desired, working in the background as conditions are monitored.

FIG. 1 is a schematic top view of an example of a floating system with mooring lines and a monitoring system. A floating system 2 can include, for example and without limitation, a floating production platform, FPSO, drill ship, spar, tension leg platform, semi-submersible ships and rigs, and others. The floating system 2 generally has a hull 4 of some shape from which mooring lines 6 can be coupled generally to the seabed (not shown). Monitoring equipment 8, such as sensors or other measurement devices, can be coupled to the mooring lines to monitor one or more conditions of the mooring line. Output from the monitoring equipment 8 can be communicated to the computer system 700. The computer system can include software and/or hardware with components and such as described in FIG. 3 below for performing a neural network model 10. The neural network model can be at least initially trained by a simulator 12 using simulation data.

Figure 2:
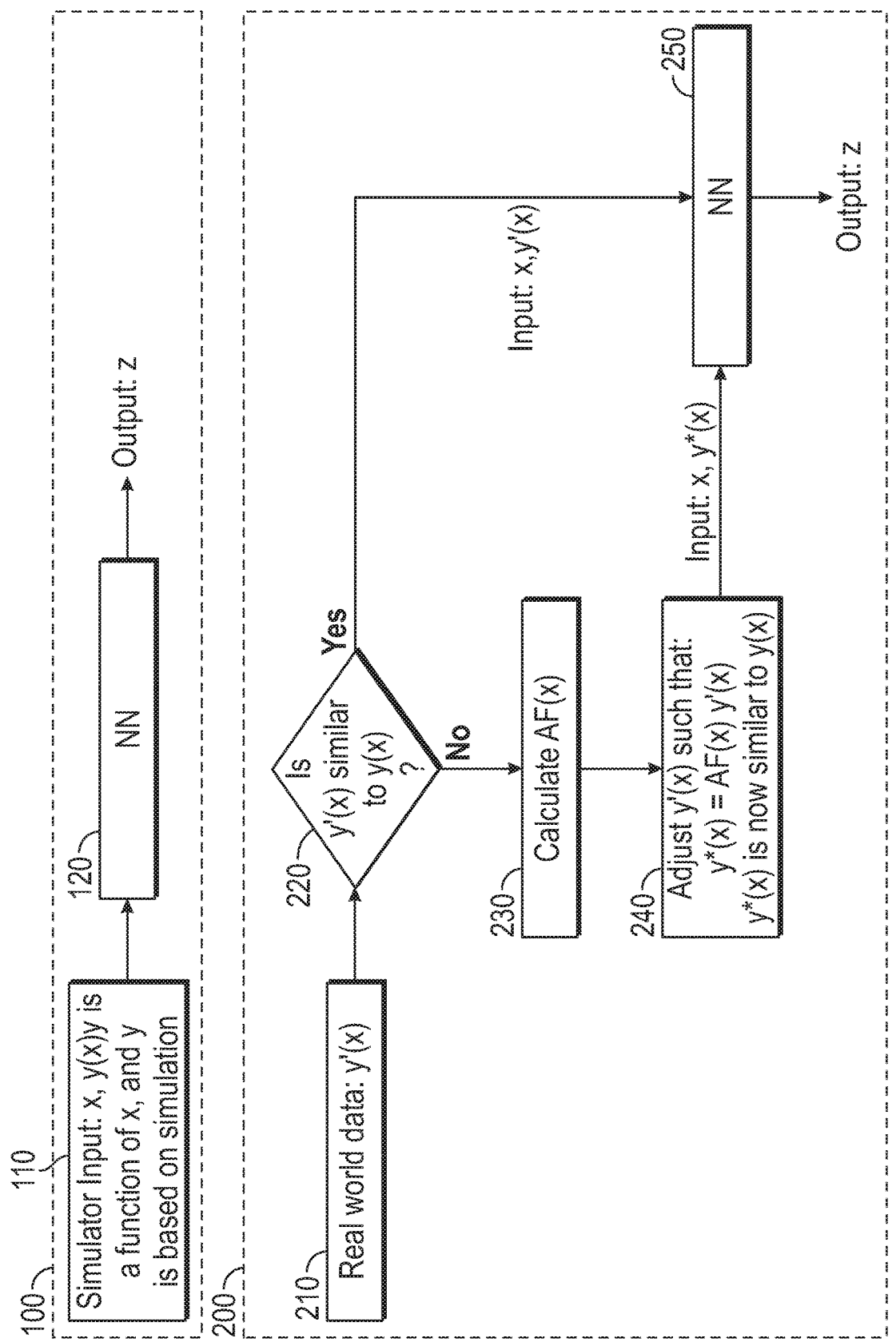
FIG. 2 is a schematic flow chart of an example of an embodiment of the invention.

FIG. 2 is a schematic flow chart of an example of an embodiment of the invention. In step 100, simulation data is used to train the neural network model (NN model). The simulation data is illustrated in the form of one or more data sets (x, y(x)), where a selected variable x produces a simulation result y as a function of x for a given simulated value of x. The NN model is trained and produces an output z.

The NN model can be placed into service and real world (RW) data generated by the system can be sent to the NN model. In step 200, the RW data is analyzed to determine if an adjustment factor is needed to the relationship between RW data to maintain the result z produced by the NN model when still using the simulation data (or an equivalent to the simulation data). A threshold metric of similarity can be initially provided into a mapping algorithm, which automatically adjusts real world data to adjusted data corresponding to the simulation data for operating the neural network model when the metric of similarity between the real world data and the simulation data exceeds the threshold metric. The adjustment is made to the relationship between the RW data, so that the NN model does not need to be retrained. The output result z is at least similar using the simulation data (x, y(x)) after applying the adjustment to the RW data. Essentially, the relationship (x, y(x)) is pre-filtered based on a more realistic input and output correlation, but without the need to make a substantial change in the decision logic provided to the NN model. Thus, the decision logic used by the NN model in handling the simulated relationship between x and y(x) in the training can continue to be used by the NN model.

More specifically, in step 210, the RW result y'(x) is generated as a function of x for a given real world value of x. In step 220, the RW result y'(x) is provided to a decision block that queries whether the simulation result y(x) is similar to the RW result y'(x) (which can account for different values of x and the corresponding results for y). "Similarity" can be mathematically defined, such as within a certain percentage or within a range of the simulation result y(x), including being equal, or other metrics. The metric of similarity can be compared with a threshold metric of similarity. If the metric of similarity satisfies the criteria of the threshold metric, then the real world data can be provided as operational data to the NN model in step 250. No adjustment is needed in the relationship between the RW data (x, y'(x)) and the simulation data (x, y(x)), because the RW data is at least similar to the simulation data. Therefore, the RW data (x, y'(x)) can be communicated to the NN model, and the NN model resulting output z is still the same or similar to output z from the simulation data in step 120.

However, if the result of the decision block in step 220 is that the metric of similarity of the RW result y'(x) and the simulation result y(x) does not satisfy the criteria of the threshold metric, then the flow path moves to step 230 for adjustments. In step 230, an adjustment factor (AF(x)) is calculated, so that the RW result y'(x) has at least a similar value as the simulation result y(x). The AF(x) can be a linear or nonlinear adjustment. In step 240, the AF(x) is applied to the RW result y'(x) to yield an adjusted result y*(x) that is at least similar to the simulation result y(x), and the adjusted data set (x, y*(x)) is at least similar to the simulation data set (x, y(x)). In step 250, the adjusted data set (x, y*(x)) that is similar to the simulation data set (x, y(x)) can be provided as operational data to the NN model that produces an output z that is at least similar to the output z in step 120.

It is known that the basic nature of NN model is noise/error tolerant. In addition, NN model can be a universal approximator that provides nonlinear input-output mapping such as by multilayer feedforward networks, and other techniques. Thus, the similar values produced by the AF for the (x, y*(x)) can be processed by the NN model to yield the similar result z.

The flow chart of FIG. 2 can be used for each variable $x_1$, $x_2$, ... $x_n$ that simulates a corresponding result $y_1$, $y_2$, ... $y_n$, so that adjusted data sets $(x_n, y*_n(x))$ can be applied to the NN model. The flow chart can also be applied to results that are dependent on multiple factors. For example, a result y may be a function of more than one variable, such as $y(x_1, x_2, ... x_n)$. The AF can be applied to the RW result y' that is dependent on multiple variables to yield the adjusted result y* that is at least similar to the simulation result y.

As an example to illustrate the concepts described above, a simulation data set might be a vessel offset x of 30 meters produces a result y of 100 seconds that indicates an intact line and a result y of 120 seconds that indicates a mooring line failure. The NN model is trained with the simulation data to take a series of escalating certain actions z, based on the simulation data ({30 meters, 100 seconds}: intact line and {30 meters, 120 seconds}: failure). However, RW data indicates the simulation model does not match the stiffness of the system in RW. RW data suggest that a vessel offset x of 30 meters corresponds to a result y' of 110 seconds for an intact line and a result y' of 132 seconds for a broken line. Then the RW y' of 110 seconds needs to be adjusted to 100 seconds for an intact line, and the RW y' of 132 seconds needs to be adjusted to 120 seconds for a broken line. The adjusted data (x, y*(x) of ({30 meters, 100 seconds}: intact line and {30 meters, 120 seconds}: failure), being the same as the simulation data (x, y), can be provided to the NN model to produce the same actions z. The NN model does not know (that is, operates independently) of the adjustment factor, and the NN model operates with the adjusted data as it did with the simulation data such that this logic ({30 meters, 100 seconds}: intact line and {30 meters, 120 seconds}: failure) still holds. Thus, the NN model does not need to be retrained. (In this example, the neural network model capabilities in learning and actions are not fully described as would be appreciated by one with ordinary skill in the art, and the decision logic and results could be quite complicated. Therefore, the example is only illustrative of the underlying concepts of the invention and without limitation.)

More broadly, an example of this application is for the detection of damaged mooring line based on the long drift periods of a floating offshore vessel. In this case, the simulated input to the neural network model could be:
Vessel position or mean vessel offset
Total mass of the vessel (draft of the vessel)
Long drift periods of the vessel for the corresponding vessel position and the total mass of the vessel
Let:
$x_1$=mean vessel offset in the surge direction
$x_2$=mean vessel offset in the sway direction
$x_3$=total mass of the vessel
$y_1$=vessel's long drift period in the surge direction from simulation
$y_2$=vessel's long drift period in the sway direction from simulation The output variables of the neural network model are damage indicators of each mooring line, one indicator for one mooring line. Then:

$$y_1 = f(x_1, x_2, x_3)$$

$$y_2 = f(x_1, x_2, x_3)$$

The long drift periods of the vessel, which are a function of vessel position and total mass, are based on the results of numerical simulation, and they are used to train a neural network model (NN model) model. Thus, the trained NN model sees everything in the "simulation world".

The corresponding RW results can be described as:
y'$_1$=vessel's long drift period in the surge direction in the real world
y'$_2$=vessel's long drift period in the sway direction in the real world In the real world, the long drift periods of the vessel at a given vessel position and for a given total mass of the vessel could be different from the long drift periods of the vessel in the "simulation world". If the vessel's long drift periods in the real world were not the same as those of the "simulation world", then the follow inequality would apply.

$$y'_1(x_1, x_2, x_3) \neq y_1(x_1, x_2, x_3)$$

$$y'_2(x_1, x_2, x_3) \neq y_2(x_1, x_2, x_3)$$

If the difference is enough, then transfer functions for adjustment factors can be established to transfer the vessel's long drift periods in the real world to those of the "simulation world". Once transferred to the 'simulation world', these adjustment factors can be used to adjust input to the simulation trained NN model, and the simulation trained NN model can work as is, since the data has been transferred into the "simulation world" data.

Figure 3:
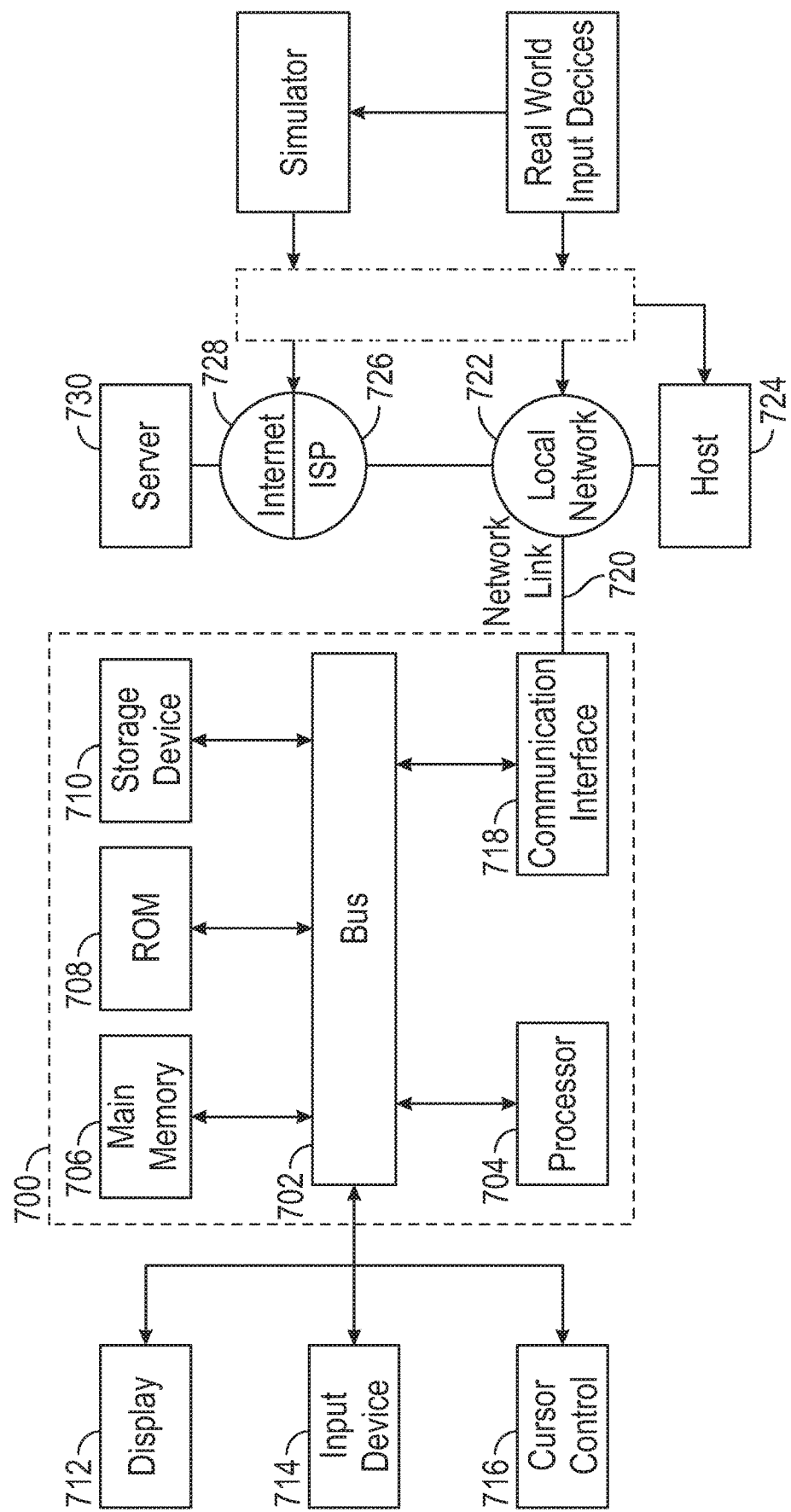
FIG. 3 is a block diagram that illustrates a computer system 700 upon which an embodiment of the invention may be implemented.

FIG. 3 is a block diagram that illustrates a computer system 700 upon which an embodiment of the invention including the neural network model may be implemented. According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

In at least one embodiment, a computer system 700 includes a bus 702 or other communication mechanism for communicating information, and a hardware processor 704 coupled with bus 702 for processing information. Hardware processor 704 may be, for example, a general-purpose microprocessor. Computer system 700 also includes a main memory 706, such as a random access memory (RAM) or other dynamic storage device, coupled to bus 702 for storing information and instructions to be executed by processor 704, and can include one or more steps shown in the flowchart of FIG. 2. Main memory 706 also may be used for storing temporary variables or other intermediate information during execution of instructions to be executed by processor 704. Such instructions, when stored in non-transitory storage media accessible to processor 704, render computer system 700 into a special-purpose machine that is customized to perform the operations specified in the instructions. Computer system 700 further includes a read only memory (ROM) 708 or other static storage device coupled to bus 702 for storing static information and instructions for processor 704. A storage device 710, such as a magnetic disk or optical disk, is provided and coupled to bus 702 for storing information and instructions. Computer system 700 may be coupled via bus 702 to a display 712, such as a light emitting diode (LED) display, for displaying information to a computer user. An input device 714, including alphanumeric and other keys, is coupled to bus 702 for communicating information and command selections to processor 704. Another type of user input device is cursor control 716, such as a mouse, a trackball, or cursor direction keys for communicating direction information and command selections to processor 704 and for controlling cursor movement on display 712. This input device typically has two degrees of freedom in two axes, a first axis (e.g., x) and a second axis (e.g., y), that allows the device to specify positions in a plane.

Computer system 700 may implement the techniques described herein using customized hard-wired logic, one or more ASICs or FPGAs, firmware and/or program logic which in combination with the computer system causes or programs computer system 700 to be a special-purpose machine. According to one embodiment, the techniques herein are performed by computer system 700 in response to processor 704 executing one or more sequences of one or more instructions contained in main memory 706. Such instructions may be read into main memory 706 from another storage medium, such as storage device 710. Execution of the sequences of instructions contained in main memory 706 causes processor 704 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 710. Volatile media includes dynamic memory, such as main memory 706. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire, and fiber optics, including the wires that comprise bus 702. Transmission media can also take the form of acoustic or light waves, such as those generated during radio wave and infrared data communications.

Various forms of media may be involved in carrying one or more sequences of one or more instructions to processor 704 for execution. For example, the instructions may initially be carried on a magnetic disk or solid-state drive of a remote computer. The remote computer can load the instructions into its dynamic memory and send the instructions over a telephone line using a modem. A modem local to computer system 700 can receive the data on the telephone line and use an infrared transmitter to convert the data to an infrared signal. An infrared detector can receive the data carried in the infrared signal and appropriate circuitry can place the data on bus 702. Bus 702 carries the data to main memory 706, from which processor 704 retrieves and executes the instructions. The instructions received by main memory 706 may optionally be stored on storage device 710 either before or after execution by processor 704.

Computer system 700 also includes a communication interface 718 coupled to bus 702. Communication interface 718 provides a two-way data communication coupling to a network link 720 that is connected to a local network 722. For example, communication interface 718 may be an integrated services digital network (ISDN) card, cable modem, satellite modem, or a modem to provide a data communication connection to a corresponding type of telephone line. As another example, communication interface 718 may be a local area network (LAN) card to provide a data communication connection to a compatible LAN. Wireless links may also be implemented. In any such implementation, communication interface 718 sends and receives electrical, electromagnetic, or optical signals that carry digital data streams representing various types of information.

Network link 720 typically provides data communication through one or more networks to other data devices. For example, network link 720 may provide a connection through local network 722 to a host computer 724 or to data equipment operated by an Internet Service Provider (ISP) 726. ISP 726 in turn provides data communication services through the worldwide packet data communication network commonly referred to as the "Internet" 728. Local network 722 and Internet 728 both use electrical, electromagnetic, or optical signals that carry digital data streams. The signals through the various networks and the signals on network link 720 and through communication interface 718, which carry the digital data to and from computer system 700, are example forms of transmission media.

The data can be real world data communicated to the system 700 from sensors, monitors, and other devices on conditions and other selected parameters, as described above. The data can also be simulation data from the simulator as described above. The data can be communicated through the host computer 724, the local network 722, or remotely through for example an ISP 726 with access to the Internet 728.

Computer system 700 can send messages and receive data, including program code, through the network(s), network link 720, and communication interface 718. In the Internet example, a server 730 might transmit a requested code for an application program through Internet 728, ISP 726, local network 722, and communication interface 718. The received code may be executed by processor 704 as it is received, and/or stored in storage device 710, or other non-volatile storage for later execution.

Other and further embodiments utilizing one or more aspects of the inventions described above can be devised without departing from the disclosed invention as defined in the claims. For example, other systems besides floating production systems can benefit from neural network model training and the efficiency of the invention and are included within the scope of the invention and applicability. As other examples, different linear and non-linear adjustment factors can be used, various methods of approximating besides multilayer feedforward methods for the neural network model can be employed, and other variations can occur within the scope of the claims.

The invention has been described in the context of preferred and other embodiments, and not every embodiment of the invention has been described. Obvious modifications and alterations to the described embodiments are available to those of ordinary skill in the art. The disclosed and undisclosed embodiments are not intended to limit or restrict the scope or applicability of the invention conceived of by the Applicant, but rather, in conformity with the patent laws, Applicant intends to protect fully all such modifications and improvements that come within the scope, including equivalents, of the following claims.

What is claimed is:

1. A method of operating a neural network model, comprising:
    providing simulation data to the neural network model, the simulation data including at least one simulated value of a variable and at least one simulation result corresponding to the at least one simulated value of the variable;
    providing decision logic to the neural network model to process the simulation data for a neural network model output;
    obtaining real world data including at least one real world value of the variable and at least one real world result corresponding to the at least one real world value of the variable;
    comparing the real world data with the simulation data to determine a metric of similarity between the real world data and the simulation data;
    providing the real world data as operational data for the neural network model if the metric of similarity is greater than a threshold metric to produce an output corresponding to an output with the simulation data from the neural network model;
    adjusting the real world data to correspond with the simulation data and providing the adjusted data as the operational data for the neural network model if the metric of similarity is not greater than the threshold metric; and
    operating the neural network model with the adjusted data to produce an output with the adjusted data corresponding to an output with the simulation data from the neural network model.

2. The method of claim 1, wherein operating the neural network model comprises operating the neural network for monitoring a floating system.

3. The method of claim 1, wherein the simulation data and real world data can apply to mooring lines on a floating system.

4. The method of claim 1, wherein the simulation data include multiple variables for the simulation result.

5. The method of claim 1, wherein providing simulation data to the neural network model comprises providing data for a floating system comprising mean floating system offset in the surge direction, mean floating system offset in the sway direction, and total mass of the floating system as variables and the floating system long drift period in the surge direction and the floating system long drift period in the sway direction as results.

6. The method of claim 5, wherein obtaining real world data comprises obtaining the floating system long drift period in the surge direction in the real world and the floating system long drift period in the sway direction in the real world.

7. A system comprising:
a central processing unit;
a non-transitory computer readable memory including processor executable program instructions that, when executed cause the central processing unit to perform operations comprising:
- storing simulation data in memory for a neural network model, the simulation data including at least one simulated value of a variable and at least one simulation result corresponding to the at least one simulated value of the variable;
- storing decision logic simulation data in the memory for the neural network model to process the simulation data;
- storing real world data in the memory including at least one real world value of the variable and at least one real world result corresponding to the at least one real world value of the variable;
- comparing the real world data with the simulation data to determine a metric of similarity between the real world data and the simulation data;
- providing the real world data as operational data for the neural network model if the metric of similarity is greater than a threshold metric to produce an output corresponding to an output with the simulation data from the neural network model;
- adjusting the real world data to correspond with the simulation data and providing the adjusted data as the operational data for the neural network model if the metric of similarity is not greater than the threshold metric; and
- operating the neural network model with the adjusted data to produce an output with the adjusted data corresponding to an output with the simulation data from the neural network model.

* * * * *